United States Patent
Lee et al.

(10) Patent No.: US 10,468,538 B1
(45) Date of Patent: Nov. 5, 2019

(54) METHOD FOR FABRICATING SEMICONDUCTOR DEVICE

(71) Applicant: United Microelectronics Corp., Hsinchu (TW)

(72) Inventors: Chih-Haw Lee, Hsinchu County (TW); Tzu-Ping Chen, Hsinchu County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 16/038,068

(22) Filed: Jul. 17, 2018

(51) Int. Cl.
| H01L 29/788 | (2006.01) |
| H01L 27/11517 | (2017.01) |
| H01L 21/768 | (2006.01) |
| H01L 29/66 | (2006.01) |
| H01L 21/02 | (2006.01) |
| H01L 21/306 | (2006.01) |
| H01L 21/8234 | (2006.01) |

(52) U.S. Cl.
CPC ........ *H01L 29/788* (2013.01); *H01L 21/0217* (2013.01); *H01L 21/30608* (2013.01); *H01L 21/7685* (2013.01); *H01L 21/823468* (2013.01); *H01L 27/11517* (2013.01); *H01L 29/66825* (2013.01)

(58) Field of Classification Search
CPC combination set(s) only.
See application file for complete search history.

(56) References Cited

U.S. PATENT DOCUMENTS

| 5,861,347 | A | 1/1999 | Maiti et al. |
| 5,879,993 | A | 3/1999 | Chien et al. |
| 6,589,842 | B2 | 7/2003 | Huang |
| 2004/0046206 | A1* | 3/2004 | Yun ................... H01L 21/28273 257/315 |
| 2004/0203205 | A1* | 10/2004 | Liu ................... H01L 21/28273 438/257 |

* cited by examiner

*Primary Examiner* — Ratisha Mehta
(74) *Attorney, Agent, or Firm* — J.C. Patents

(57) ABSTRACT

A method for fabricating semiconductor device includes providing a substrate having a first device region and a second device region. Floating gate structure is formed in the first device region. Liner layer and nitride layer are sequentially deposited over the first device region and the second device region. The floating gate structure is conformally covered. Etching back process is performed on the nitride layer to reduce thickness of the nitride layer. The first device region is still covered by the nitride layer. A photomask layer is formed over the substrate with an opening region to expose the second device region for cleaning. The photomask layer is removed. A gate oxide layer grows on the substrate in the second device region. Anisotropic etching process is performed to remove the nitride layer, resulting in a nitride spacer on a lower portion of a sidewall of the floating gate structure.

15 Claims, 6 Drawing Sheets

METHOD FOR FABRICATING SEMICONDUCTOR DEVICE

BACKGROUND

1. Field of the Invention

The present invention generally relates to semiconductor fabrication technology, and particularly to the formation of flash memory cell.

2. Description of Related Art

The flash memory is more and more popular in the electronic device to store the non-volatile data. In order to improve the memory capacity and the performance of the flash memory, the cell structure has a great development.

Further to improve the operation performance, the input/output (I/O) operation voltage is no longer limited to the low voltage, such as 3.3V. Some flash memory would be operated at I/O high voltage, such as about 5V. However, since the fabrication of the I/O transistor for the higher operation voltage need to grow thicker gate oxide layer, this process would also affect the tunnel oxide layer under the floating gate, causing degrade of performance.

How to improve the tunnel oxide layer under the floating gate to adapt the higher I/O voltage is an issue to be concerned and improved.

SUMMARY OF THE INVENTION

In accordance with embodiments, the invention provides a flash memory cell, in which the quality of the tunnel oxide layer under the floating gate can be improved, so to adapt the operation at the higher I/O voltage higher than 3.3 V.

In an embodiment, the invention provides a method for fabricating semiconductor device. The invention includes providing a substrate, wherein the substrate comprises a first device region and a second device region. Then, a floating gate structure is formed in the first device region. A liner layer and a nitride layer are sequentially disposed over the first device region and the second device region, wherein the floating gate structure is conformally covered. An etching back process is performed on the nitride layer to reduce a thickness of the nitride layer, wherein the first device region is still covered by the nitride layer. A photomask layer is formed over the substrate with an opening region to expose the second device region. The second device region is cleaned. The photomask layer is removed. A gate oxide layer is grown on the substrate in the second device region. An anisotropic etching process is performed to remove the nitride layer, resulting in a nitride spacer on a lower portion of a sidewall of the floating gate structure.

In an embodiment, as to the method for fabricating semiconductor device, the step of forming the floating gate structure comprises forming a tunnel oxide layer on the substrate. A polysilicon layer is formed on the oxide layer. A silicon nitride layer is formed on the polysilicon layer, wherein the silicon nitride layer has an opening at the first device region; forming a polysilicon oxide on the polysilicon layer in the opening. The silicon nitride layer, the polysilicon layer and the tunnel oxide layer are removed, wherein a portion of the polysilicon layer and the tunnel oxide layer under the polysilicon oxide remains to form the floating gate structure.

In embodiment, as to the method for fabricating semiconductor device, the nitride layer after the etching back process remains fully covering the floating gate structure at the first device region.

In an embodiment, as to the method for fabricating semiconductor device, the gate oxide layer on the substrate as grown in the second device region is a part of the input/output transistor, which is to be operated by an input/output voltage in a range of 4V to 7V.

In an embodiment, as to the method for fabricating semiconductor device, in the step of performing the anisotropic etching process, the nitride layer is an exposed state in first device region, an etchant with etching selection ratio to nitride is used to remove the nitride layer.

In an embodiment, as to the method for fabricating semiconductor device, the step of performing the anisotropic etching process comprises using an etching mask layer to cover the second device region while the nitride layer is etched.

In an embodiment, as to the method for fabricating semiconductor device, the method further comprises performing an implanting process to dope the substrate to form a doped well at a predetermined position in the second device region.

In an embodiment, as to the method for fabricating semiconductor device, the step of growing the gate oxide layer comprises a thermal oxidation process, wherein a polysilicon material of the floating gate structure in the first device region remains a protection by the nitride layer to resist the thermal oxidation process.

In an embodiment, as to the method for fabricating semiconductor device, the lower portion of the sidewall of the floating gate structure for forming the nitride spacer is equal to or less than ⅓ of the sidewall of the floating gate structure.

In an embodiment, as to the method for fabricating semiconductor device, the floating gate structure comprises a floating polysilicon layer and a tunnel oxide layer, sequentially stacked on the substrate, wherein the tunnel oxide layer has a central region thickness and an edge thickness, and a thickness ratio of the edge thickness to the central region thickness is in a range of less than or equal to 1.7 and greater than 1.

In an embodiment, as to the method for fabricating semiconductor device, the step of growing the gate oxide layer also oxidizes the floating polysilicon layer at an edge region to have the edge thickness.

In an embodiment, as to the method for fabricating semiconductor device, the thickness ratio is in a rage of 1.6 to 1.2.

In an embodiment, the invention provides a floating gate structure of semiconductor device, comprising a floating gate structure on the substrate, wherein the floating gate structure comprises a tunnel oxide layer on a substrate, a polysilicon layer on the tunnel oxide layer, and a polysilicon oxide layer on the polysilicon layer. A liner oxide layer is disposed on the substrate covering the floating gate structure. A nitride spacer is disposed on the liner oxide layer at a lower portion of a sidewall of the floating gate structure. The tunnel oxide layer has a central region thickness and an edge thickness, and a thickness ratio of the edge thickness to the central region thickness is equal to or less than 1.7, and greater than 1.

In an embodiment, as to the floating gate structure, the thickness ratio is in a range of 1.6 to 1.2.

In an embodiment, as to the floating gate structure, the nitride spacer is less than ⅓ of a sidewall of the floating gate structure.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention is directed to a memory cell structure based on the structure having a control gate and a floating gate. The smile effect in the floating gate structure as to be described later can be reduced while the I/O operation voltage can be higher than the usual voltage of 3.3V.

Several embodiments are provided for describing the invention. However, the invention is not limited to the provided embodiments.

Figure 1:
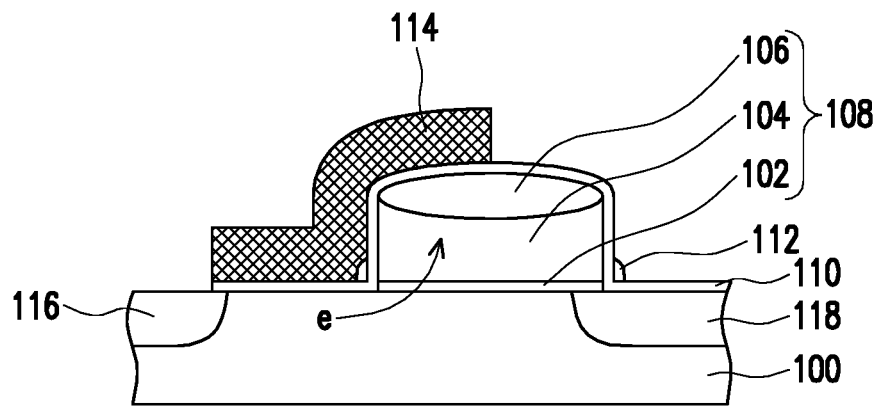
FIG. 1 is a drawing, schematically illustrating a cell structure of a flash memory, according to an embodiment of the invention.

FIG. 1 is a drawing, schematically illustrating a cell structure of a flash memory, according to an embodiment of the invention. Referring to FIG. 1, generally in an embodiment, a floating gate structure 108 of a memory cell is formed on a substrate 100. A liner layer 110 is formed on the substrate 100 and covers over the floating gate structure 100. In this design of the cell structure, it also includes a short nitride spacer 112, located on the bottom portion of the sidewalls of the floating gate structure. Then, the control gate structure 114 is formed on the liner layer 110 and over the floating gate structure 108. The source/drain region 116, 118 are also formed in the substrate at two side of the integrated structure of the control gate structure 114 and the floating gate structure 108. The nitride spacer 112 can protect against the reverse tunnelling from the floating gate layer 104 to the control gate structure 114.

The floating gate structure 108 includes tunnel oxide layer 102, the polysilicon gate layer 104 and the polysilicon oxide cap 106, sequentially sacked on the substrate 100. The fabrication procedure is to be described layer.

However, when looking into the floating gate structure 108 in better detail, the tunnel oxide layer 102 of the floating gate structure 108 may have a smile effect due to the fabrication of the gate oxide layer of the I/O transistor beside the floating gate structure, in which a thermal oxidation is involved.

Figure 2:
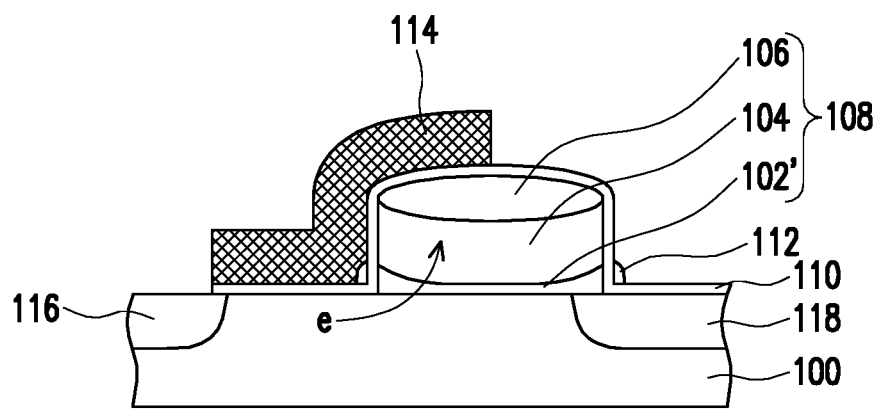
FIG. 2 is a drawing, schematically illustrating a cell structure of a flash memory with the smile effect, according to an embodiment of the invention.

FIG. 2 is a drawing, schematically illustrating a cell structure of a flash memory with the smile effect, according to an embodiment of the invention. Referring to FIG. 2, the thermal oxidation to form the gate oxide layer of the I/O transistor would also cause the bottom side portion of the polysilicon gate layer 104 to be slightly oxidized. Then, both the end sides of the tunnel oxide layer 102', such as tunnel oxide layer, gradually get thicker. As a result, it looks like a smile profile with upturned at the end portions. This effect is then also called smile effect as observed in the invention.

In further looking into the mechanism in causing the smile effect, it can be realized as follows. When the I/O operation voltage goes up, higher than the usual operation voltage for the I/O transistor at low voltage at the level of 3.3V. The I/O transistor operated at higher voltage, such as 5 V or in a range of 4V to 7V, the gate insulating layer needs to be thicker. The thicker gate insulating layer in the I/O transistor would involve a high temperature thermal oxidation. The high temperature thermal oxidation may cause the bottom side portion of the polysilicon gate layer 104 to be further oxidized. Then, the smile effect gets worse.

As observed in the invention, when the smile effect gate would cause thicker at the end portion of the tunnel oxide layer 102'. During the programming operation, the route for the electrons to enter the floating gate layer 104 gets longer. This would degrade the programming efficiency. This smile effect is observed in more serious when the I/O transistor is formed for adapting the higher operation voltage.

After looking into the issue of the smile effect, the invention has also proposed the method to fabricate the semiconductor device of memory cell. The smile effect can be reduced even under the operation at high voltage.

FIG. 3A-3H are drawings, schematically illustrating the fabrication flow for a memory cell, according to an embodiment of the invention.

Figure 3A:
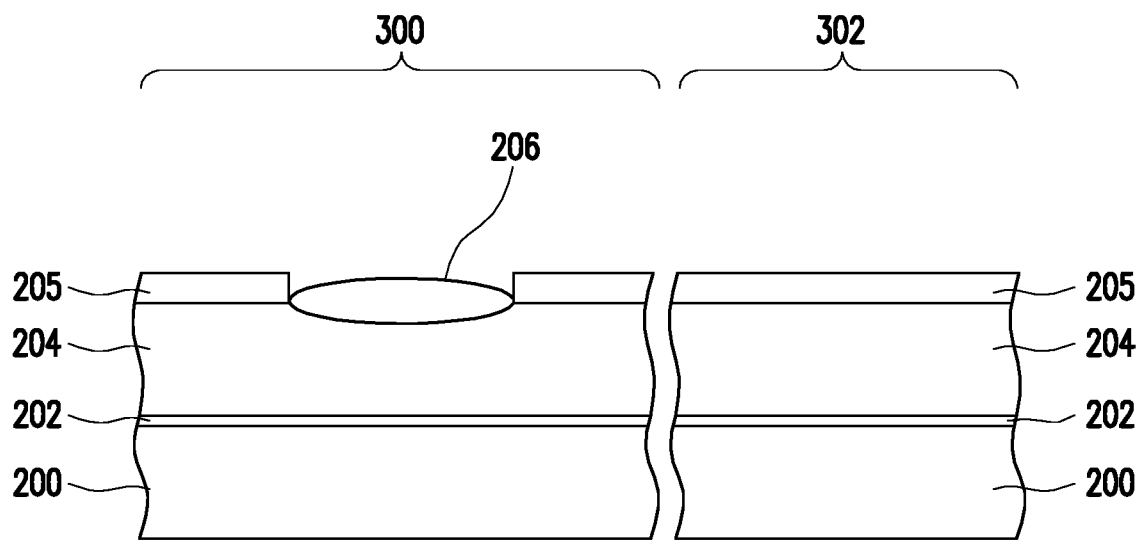
FIG. 3A-3H are drawings, schematically illustrating the fabrication flow for a memory cell, according to an embodiment of the invention.

Referring to FIG. 3A, a substrate 200 has been configured to at least have a first device region 300 and a second device region 302. A tunnel oxide layer 202 is formed on the substrate 200. A polysilicon layer 204 is then formed on the tunnel oxide layer 202. A nitride layer 205 is then disposed on the polysilicon layer 204 with an opening in the first device region 300 to expose the polysilicon layer 204. A polysilicon oxide cap 206 is formed by a high temperature oxidation process on the polysilicon layer 204 within the opening of the nitride layer 205.

Figure 3B:
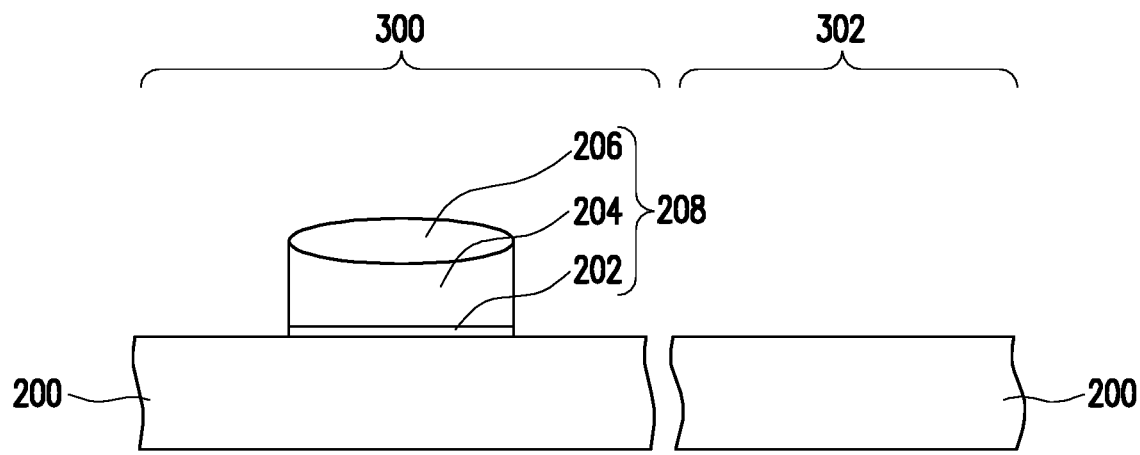

Referring to FIG. 3B, the nitride layer 205, the polysilicon layer 204 and the tunnel oxide layer 202 are removed. However, a portion of the nitride layer 205, the polysilicon layer 204 and the tunnel oxide layer 202 under the polysilicon oxide cap 206 remain to form the floating gate structure 208.

Figure 3C:
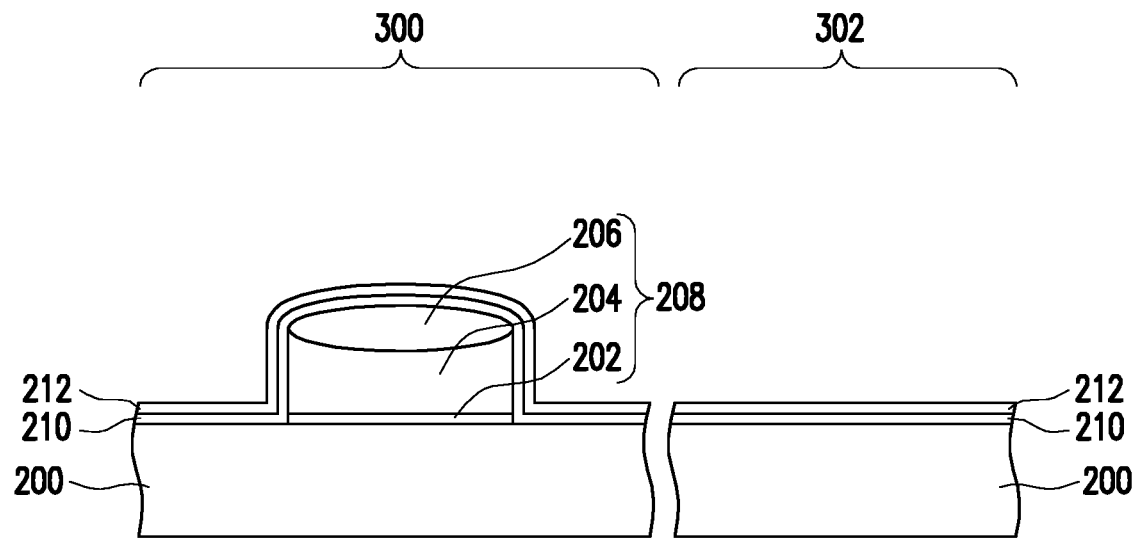

Referring to FIG. 3C, a liner layer 210 serving as another tunnel oxide layer is formed on the substrate and covers over the floating gate structure 208. A nitride layer 212 is then formed on the liner layer 210.

Figure 3D:
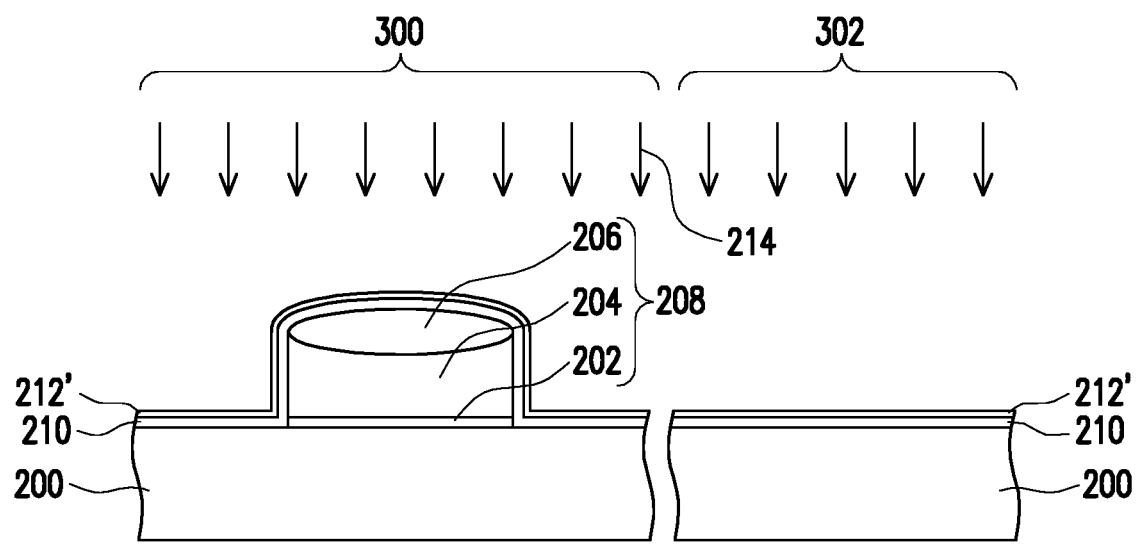

Referring to FIG. 3D, an anisotropic etching process 214, such as a etching back, is performed on the nitride layer 212 so to reduce the thickness of the nitride layer 212. As a result, the nitride layer 212 becomes the nitride layer 212'. In this situation, the floating gate structure 208 is still covered by the nitride layer 212', so to provide the protection effect from the subsequent thermal oxidation process.

Figure 3E:
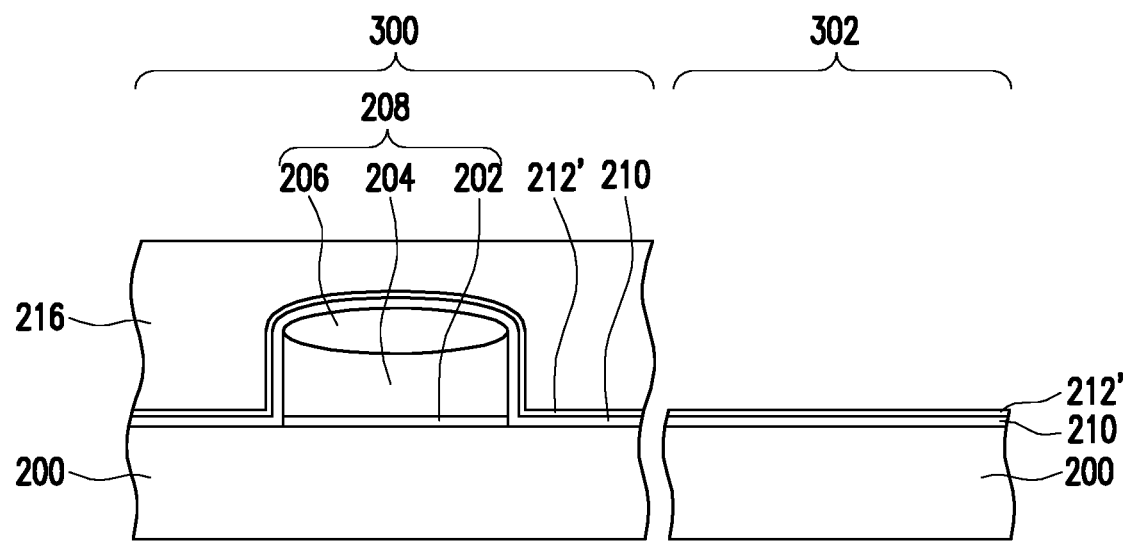

Referring to FIG. 3E, a photomask layer 216 is formed on the substrate at the first device region 300 while the device region 302 is exposed by an opening region of the photomask layer 216.

Figure 3F:
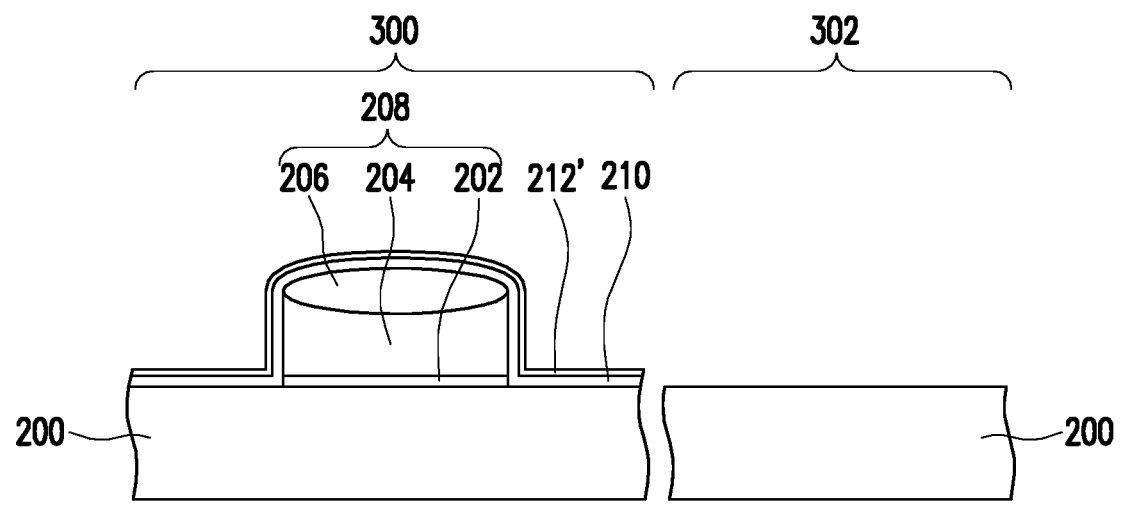

Referring to FIG. 3F, with the photomask layer 216, the nitride layer 212' and the tunnel oxide layer 210 at the second device region 302 is removed. Further the second device region 302 is further cleaned and the photomask layer 216 is also removed.

Figure 3G:
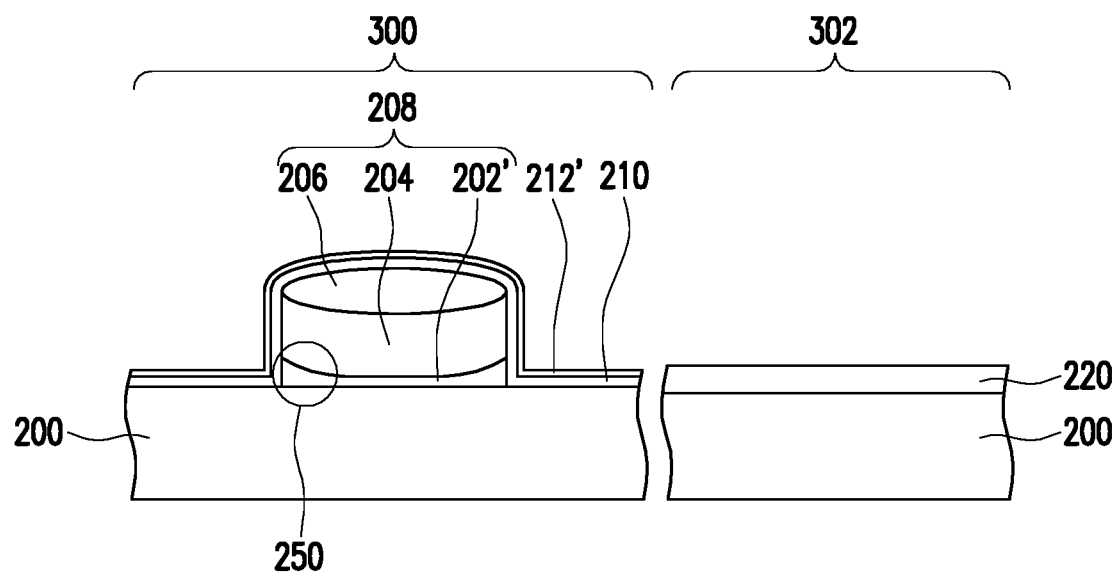

Referring to FIG. 3G, the second device region is used to form the I/O transistor which is to be operated at higher operation voltage, greater than 3.3 V, such as in a range of 4V to 7V. In this kind of high-voltage transistor, the gate oxide layer 220 should be thicker and is usually formed by high temperature thermal oxidation process in an example.

It can be noted that, when the gate oxide layer 220 grows with larger thickness, the bottom end portion 250 of the polysilicon layer 204 of the floating gate structure 208 may also be slightly oxidized, and the smile effect occurs. However, the nitride layer 212' stills covers the liner layer 210 over the floating gate structure 208, which is then protected from the thermal oxidation process. The smile effect can be effectively reduced.

A situation has been looked into by the invention that if the liner layer 210 in oxide mater is not covered by the nitride layer 212', the liner layer 210 with the tunnel oxide layer 202' together are involved in the thermal oxidation process. The smile effect at the bottom end portion 250 of the polysilicon layer 204 would get more serious, resulting in thicker at the bottom end portion 250. The smile effect would reduce the programming efficiency.

Figure 3H:
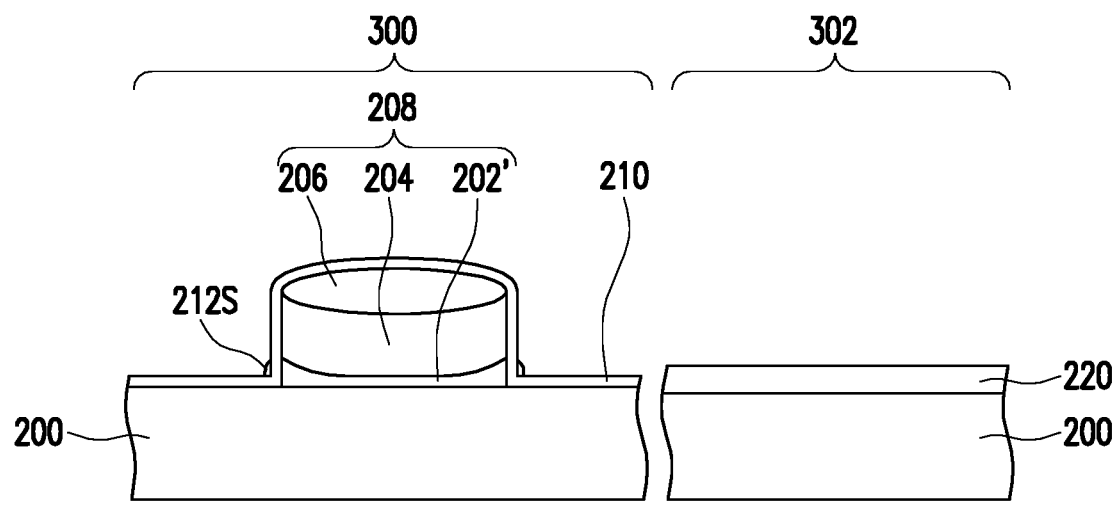

Referring to FIG. 3H, an anisotropic etching process is then performed to remove the nitride layer 212', resulting in a mini nitride spacer 212S on a lower portion of a sidewall of the floating gate structure 208. In an embodiment, the height of the mini nitride spacer 212S about ⅓ of the sidewall of the floating gate structure 208 or even less.

As also stated in FIG. 2, the control gate structure 114 is subsequently formed on the liner layer 210, 110. The mini nitride spacer 212S can further protect against the reverse tunnelling from the polysilicon layer 204 to the control gate structure 114.

As to effect to reduce the smile effect in the invention, it can be observed by comparing two thickness of the tunnel oxide layer 202' of the floating gate structure 208.

Figure 4:
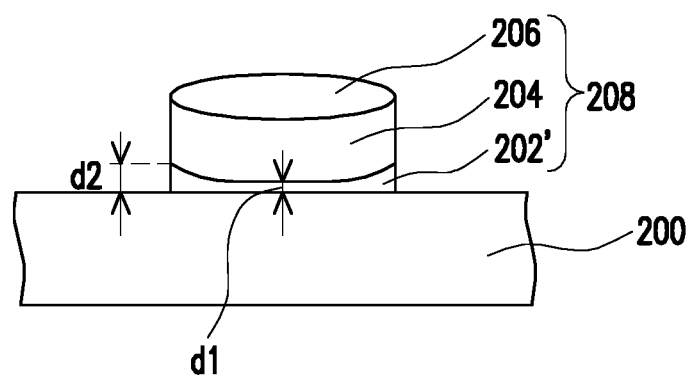
FIG. 4 is a drawing schematically illustrating a floating gate structure with the smile effect of a memory cell, according to an embodiment of the invention.

FIG. 4 is a drawing schematically illustrating a floating gate structure with the smile effect of a memory cell, according to an embodiment of the invention. Referring to FIG. 4, to define the reducing level of the smile effect, the thickness d1 is referring to the thickness at the central part of the tunnel oxide layer 202' while the thickness d2 is referring to the thickness at the end part of the tunnel oxide layer 202'. The thickness ratio of d2 to d1 is 1.7 or less, and greater than 1. In an embodiment, the thickness ratio is in a range of 1.7 to 1.2. In an embodiment the thickness ratio is in a range of 1.6 to 1.2. It has been observed that, the thickness ratio would be greater than 1.7 due to larger thickness d2 if there no protection of the nitride layer 212' on the floating gate structure 208 as described in FIG. 3G.

The invention has proposed the floating gate structure 208, which has smaller smile effect. At least, the programming efficiency with respect to the higher I/O operation voltage can be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating semiconductor device, comprising:
   providing a substrate, wherein the substrate comprises a first device region and a second device region;
   forming a floating gate structure in the first device region;
   sequentially depositing a liner layer and a nitride layer over the first device region and the second device region, wherein the floating gate structure is conformally covered by the liner layer and the nitride layer;
   performing an etching back process on the nitride layer to reduce a thickness of the nitride layer, wherein the first device region is still covered by the nitride layer;
   forming a photomask layer over the substrate with an opening region to expose the second device region;
   cleaning the second device region;
   removing the photomask layer;
   growing a gate oxide layer on the substrate in the second device region; and
   performing an anisotropic etching process to remove the nitride layer, resulting in a nitride spacer on a lower portion of a sidewall of the floating gate structure.

2. The method for fabricating semiconductor device in claim 1, wherein the step of forming the floating gate structure comprises:
   forming a tunnel oxide layer on the substrate;
   forming a polysilicon layer on the oxide layer;
   forming a silicon nitride layer on the polysilicon layer, wherein the silicon nitride layer has an opening at the first device region;
   forming a polysilicon oxide on the polysilicon layer in the opening; and
   removing the silicon nitride layer, the polysilicon layer and the tunnel oxide layer, wherein a portion of the polysilicon layer and the tunnel oxide layer under the polysilicon oxide remains to form the floating gate structure.

3. The method for fabricating semiconductor device in claim 1, wherein the nitride layer after the etching back process remains fully covering the floating gate structure at the first device region.

4. The method for fabricating semiconductor device in claim 1, wherein the gate oxide layer on the substrate as grown in the second device region is a part of the input/output transistor, which is to be operated by an input/output voltage in a range of 4V to 7V.

5. The method for fabricating semiconductor device in claim 1, wherein in the step of performing the anisotropic etching process, the nitride layer is an exposed state in first device region, an etchant with etching selection ratio to nitride is used to remove the nitride layer.

6. The method for fabricating semiconductor device in claim 1, wherein the step of performing the anisotropic etching process comprises using an etching mask layer to cover the second device region while the nitride layer is etched.

7. The method for fabricating semiconductor device in claim 1, further comprising performing an implanting process to dope the substrate to form a doped well at a predetermined position in the second device region.

8. The method for fabricating semiconductor device in claim 1, wherein the step of growing the gate oxide layer comprises a thermal oxidation process, wherein a polysilicon material of the floating gate structure in the first device region remains a protection by the nitride layer to resist the thermal oxidation process.

9. The method for fabricating semiconductor device in claim 1, wherein the lower portion of the sidewall of the floating gate structure for forming the nitride spacer is equal to or less than ⅓ of the sidewall of the floating gate structure.

10. The method for fabricating semiconductor device in claim 1, wherein the floating gate structure comprises a floating polysilicon layer and a tunnel oxide layer, sequentially stacked on the substrate, wherein the tunnel oxide layer has a central region thickness and an edge thickness, and a thickness ratio of the edge thickness to the central region thickness is in a range of less than or equal to 1.7 and greater than 1.

11. The method for fabricating semiconductor device in claim 10, wherein the step of growing the gate oxide layer also oxidizes the floating polysilicon layer at an edge region to have the edge thickness.

12. The method for fabricating semiconductor device in claim 10, wherein the thickness ratio is in a range of 1.6 to 1.2.

13. A floating gate structure of semiconductor device, comprising:
- a floating gate structure on a substrate, wherein the floating gate structure comprises:
- a tunnel oxide layer on the substrate;
- a polysilicon layer on the tunnel oxide layer; and
- a polysilicon oxide layer on the polysilicon layer;
- a liner oxide layer on the substrate covering the floating gate structure; and
- a nitride spacer, on the liner oxide layer at a lower portion of a sidewall of the floating gate structure,
- wherein the tunnel oxide layer has a central region thickness and an edge thickness, and a thickness ratio of the edge thickness to the central region thickness is in a range of equal to or less than 1.7 and greater than 1.

14. The floating gate structure in claim 13, wherein the thickness ratio is in a range of 1.6 to 1.2.

15. The floating gate structure in claim 13, wherein the nitride spacer is less than ⅓ of a sidewall of the floating gate structure.

* * * * *